United States Patent [19]

Rasmussen et al.

[11] Patent Number: 5,224,200
[45] Date of Patent: Jun. 29, 1993

[54] COHERENCE DELAY AUGMENTED LASER BEAM HOMOGENIZER

[75] Inventors: Paul Rasmussen, Livermore; Anthony Bernhardt, Berkeley, both of Calif.

[73] Assignee: The United States of America as represented by the Department of Energy, Washington, D.C.

[21] Appl. No.: 799,524

[22] Filed: Nov. 27, 1991

[51] Int. Cl.$^5$ .............................................. G02B 6/00
[52] U.S. Cl. ........................................ 385/146; 372/9; 372/93; 372/99; 372/107
[58] Field of Search ....................... 372/29, 107, 6, 99, 372/93, 9; 385/146

[56] References Cited

U.S. PATENT DOCUMENTS

| | | | |
|---|---|---|---|
| 4,521,075 | 6/1985 | Obenschain et al. | 372/103 |
| 4,744,615 | 5/1988 | Fan et al. | 385/146 |

FOREIGN PATENT DOCUMENTS 0009593  1/1991  Japan .................................. 372/107

Primary Examiner—Georgia Y. Epps
Attorney, Agent, or Firm—Henry P. Sartorio; Roger S. Gaither; William R. Moser

[57] ABSTRACT

The geometrical restrictions on a laser beam homogenizer are relaxed by using a coherence delay line to separate a coherent input beam into several components each having a path length difference equal to a multiple of the coherence length with respect to the other components. The components recombine incoherently at the output of the homogenizer, and the resultant beam has a more uniform spatial intensity suitable for microlithography and laser pantography. Also disclosed is a variable aperture homogenizer, and a liquid filled homogenizer.

17 Claims, 4 Drawing Sheets

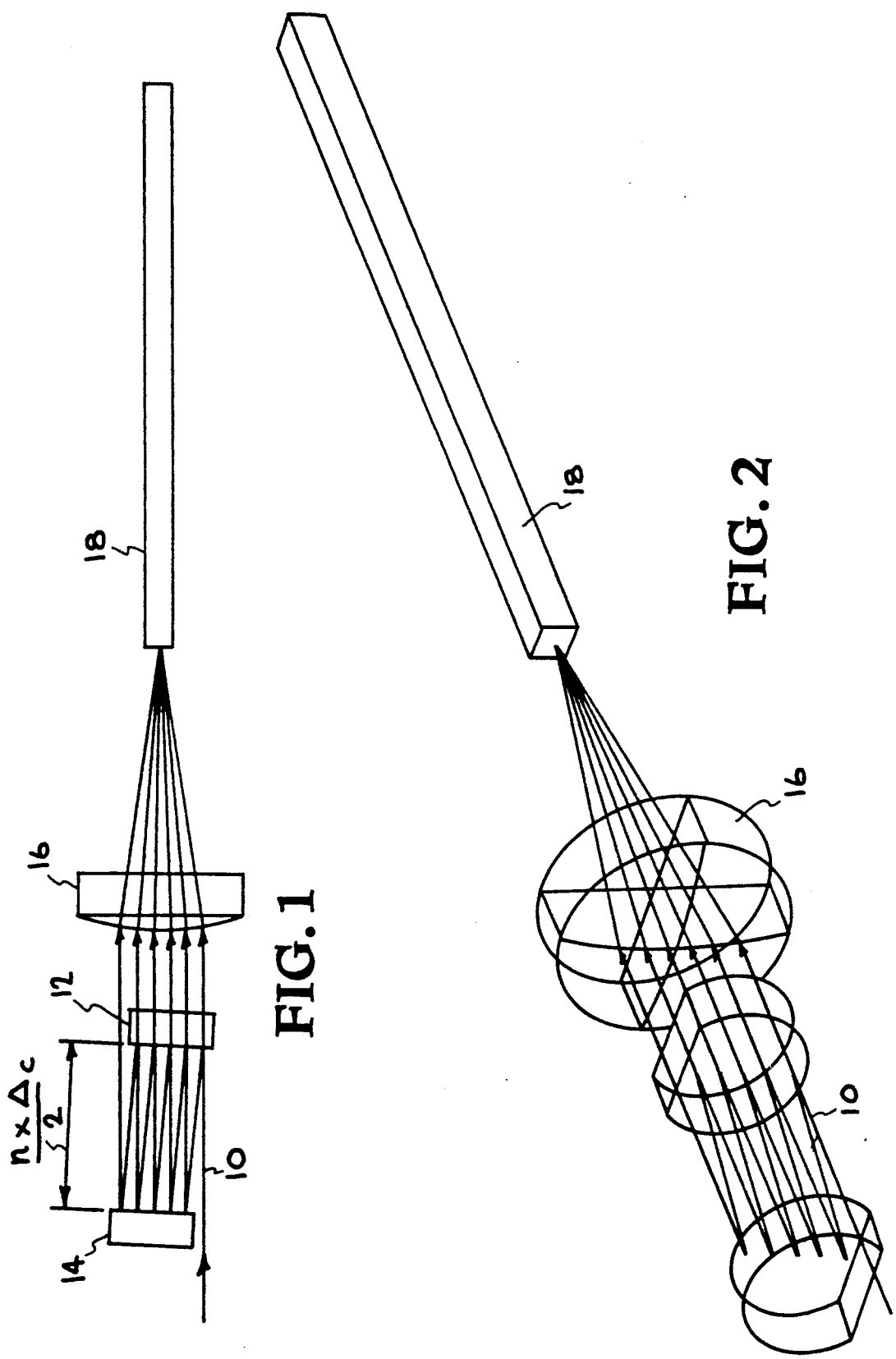

COHERENCE DELAY AUGMENTED LASER BEAM HOMOGENIZER

The U.S. Government has rights in this invention pursuant to Contract No. W-7405-ENG-48 between the U.S. Department of Energy and the University of California for the operation of Lawrence Livermore National Laboratory.

BACKGROUND OF THE INVENTION

The present invention relates to lasers. In particular, the present invention relates to smoothing out variations in the intensity of a laser beam so that it will uniformly illuminate an image plane.

Light in the visible, near ultraviolet, and ultraviolet range is useful for such applications as laser pantogography and microlithography. Lasers are the most intense source of light, but they fail to provide a beam with uniform intensity across its cross section. This causes problems when forming eutectics or developing photoresist, because a uniform beam is important for both predicting and reducing the time required for these process steps.

There are two problems that are associated with reducing variations in beam intensity. The first is that laser beams have relatively long coherence lengths, which results in diffraction effects that produce intensity variations across the beam. The second is that the beams themselves are rarely, if ever, of uniform spatial intensity.

One solution to this problem has been proposed by Obenschain et al. in U.S. Pat. No. 4,521,075 dated Jun. 4, 1985. This patent describes a stepped lens with step heights great enough to separate the portions of the beam coming through different steps by at least their coherence length. The various portions of the beam are then recombined with a focusing lens to provide a more uniform intensity distribution. The necessary step height is at least $\Delta_c/(n-1)$, where $\Delta_c$ is the coherence length and n is the index of refraction of the lens material. Unfortunately, lasers having wavelengths suitable for high resolution microlithography or pantogography generally have coherence lengths that would require large, expensive, and lossy lenses to satisfy the above conditions.

Another more practical and less lossy solution to this problem has been proposed by Fan et al. In U.S. Pat. No. 4,744,615 dated May 17, 1988, and assigned to I.B.M. Corporation. This patent describes a "homogenizer"—usually made of glass, this is an internally reflective light tunnel with a polygonal cross section that breaks the beam up into an array of apparent light sources emanating from different positions. The geometry of the homogenizer has the effect of causing different parts of the beam to travel different distances while inside the homogenizer. Upon exiting the homogenizer, the output beam is more incoherent and consequently has more uniform spatial intensity. To achieve a truly high degree of incoherence the maximum path length difference from the various "sources" to the image plane must differ by at least the coherence length of the original beam. For this to happen the following two conditions must be satisfied:

$$W_{min} = \Delta_c[R + (1+R^2)^{\frac{1}{2}}] > 2R\Delta_c$$

$$R_{min} = \cot(\phi),$$

Here $W_{min}$ is the minimum required width of the homogenizer channel, $R = L/W$ (length divided by width) is the aspect ratio of the channel, and $\Delta_c$ is the coherence length of the beam. The angle $\phi$ is the largest angle of an input array with respect to the optical axis that will be accepted by the tunnel.

If the above conditions are not satisfied, the beam sections from the different "sources" will not have path length differences greater than the coherence length, and the beams will tend to recombine coherently with a resultant nonuniform spatial intensity at the exit aperture of the homogenizer. Again, many potentially useful lasers for microlithography and pantogography have such long coherence lengths that these limitations are also too restrictive. This has been a failing to this type of device for some time.

For instance, the homogenizer conditions can only be easily be met when $\Delta_c$ is smaller than about 3 mm. For $Ar^+$ or bandwidth narrowed eximer lasers with the coherence lengths closer to 30 mm, the manufacturing costs of suitable homogenizers and imaging optics becomes very prohibitive because of the large optics that are necessary to achieve a 30 millimeter path length difference. There thus exists a need to relax these restrictive guidelines. One method of doing this is to reduce the apparent coherence length of the homogenizer input beam so the size of the homogenizer and its accompanying optics may be reduced.

SUMMARY OF THE INVENTION

It is an object of the present invention to provide an apparatus that can reduce the apparent coherence length of a laser beam so the beam can be used with an in expensive homogenizer to produce an output beam with a uniform spatial intensity across its entire cross section.

It is a further object of the invention to provide an improved homogenizer with a variable aperture size that is simple and easily made.

It is still an additional object of the invention to provide an improved liquid filled homogenizer utilizing total internal reflection for improved efficiency.

These, and other objects of the invention are realized by using a "coherence delay line", according to the present invention, in series between a laser and a homogenizer. The coherence delay line is an optical "line" that comprises two mirrors, one partially reflecting, and one totally reflecting, arranged so that light incident from the laser first strikes the partially reflecting mirror. A portion of the beam passes through, and a portion is reflected back to the totally reflecting mirror. The portion that was reflected is in turn reflected back to the partially reflecting mirror at a position spaced from the position of initial incidence, where again a portion is transmitted, and a portion is reflected. This process is repeated until the reflected beam has traversed the partially reflecting mirror, and finally bypasses the partially reflecting mirror altogether. The series of beams transmitted through the partially reflecting mirror, and the final beam that bypasses it altogether, are focused through a lens into the homogenizer.

The two mirrors are separated by a distance equal to an integer multiple of half the coherence length of the initial beam, so the beams entering the homogenizer are all offset by multiples of their coherence length. This has the effect of reducing the apparent coherence length of the light entering the homogenizer. Rather than a single beam of constant coherences entering the homogenizer, there are now several beams that are completely incoherent with respect to each other entering the homogenizer from slightly different directions. This is also an improvement over the prior art, whose only stipulation was that the path length difference be more than the coherence length. In fact, one gets diffraction effects if the path length differences are not an integer multiple of the coherence length, even if they are greater than the coherence length.

When the various beams are recombined with the outputs optics at the homogenizer exit they have been delayed by multiples of the coherence length, and they therefore recombine incoherently. Incoherent recombination, unlike coherent recombination which results in interference due to a nonzero phase dependence, is phase independent, and the laser beam recombination at the exit aperture of the homogenizer will be a simple summing operation that results in greater spatial uniformity. (The phase dependence averages to zero for incoherent recombination.)

The coherence delay line can be used with the homogenizer disclosed in U.S. Pat. No. 4,744,615, or it can preferably be used with improved variable aperture or liquid filled homogenizers, also according to the present invention. The invention will become clearer with reference to the following more detailed description and accompanying drawings.

BRIEF DESCRIPTION OF THE DRAWINGS

FIG. 1 shows a side view of a coherence delay line according to the present invention.

FIG. 2 shows a more illustrative perspective of a coherence delay line according to the present invention.

DESCRIPTION OF THE PREFERRED EMBODIMENTS

Figure 3A:
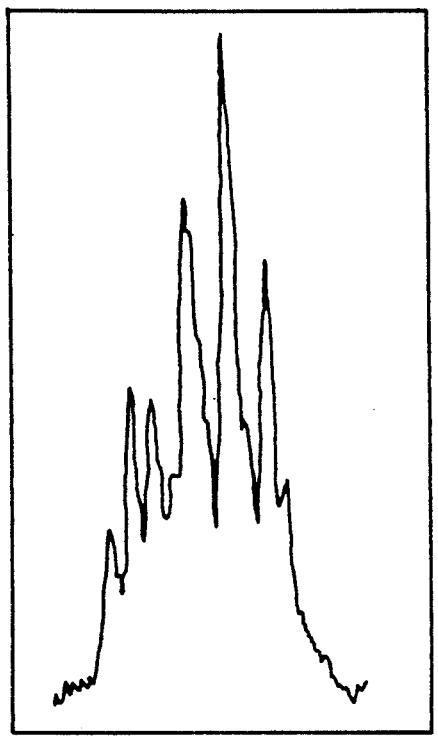
FIGS. 3a–3d illustrate how two beams from an Ar+ laser separated by a coherence length improve spatial uniformity at the homogenizer output.

The coherence delay line 10 is a simple two mirror device, as shown in FIGS. 1 and 2. The incident laser beam is first intercepted by mirror 12, which is a partially reflecting first surface mirror. A portion of the beam is transmitted, and the remainder is reflected back to mirror 14, which is a fully reflecting first surface mirror. All of the beam that strikes mirror 14 is reflected back to mirror 12. Again, a portion of the beam is transmitted, and the remainder is reflected back to mirror 14. The process is repeated several times, and each time it repeats the beam traverses across the mirrors by a small distance. This occurs because the mirrors face each other with surface normals at a slight angle with respect to the optical axis, and the incident beam is parallel to the optical axis. As a consequence, as shown in FIG. 1, adjacent beams propagating towards lens 16 are also parallel to the optical axis, and have a path length difference that is twice the separation from mirror 12 to mirror 14. (FIG. 2 shows the mirrors as advantageously having flattened portions to allow for the incident and final beams in coherence delay line 10, but the mirrors may also have other shapes.)

If mirror 12 has a constant percentage reflective coating, the portion of the beam that is transmitted will be monotonically decreasing in intensity each time the beam strikes mirror 12. In this case the reflective areas can be coated with the same partially reflective coating.

However, in a preferred embodiment mirror 12 has separate coatings with increasing transmission coefficients at each successive beam incidence position. By making the successive coatings thinner one can appropriately increase the transmission coefficient at each area where the beam strikes mirror 12. For instance, one may use fewer layers in a multilayer, quarter wavelength reflective coating. In this way each transmitted beam can have approximately the same intensity.

To optimize the performance of coherence delay line 10, the distance between the mirrors is $n\Delta_c/2$, (where $n = 1, 2, 3, \ldots$). The path length difference between beams entering homogenizer 18 will then be equal to an integral multiple of the coherence length. Although each individual beam may be coherent, they are all incoherent with respect to each other because of their different relative path lengths. Advantageously, the restrictions on the dimensions of homogenizer 18 may then be relaxed with this type of an input. The set of mutually incoherent beams are equivalent to a single beam with a very short coherence length, i.e. less than 3 mm, although each individual beam may have a coherence length considerably longer than 3 mm. Thus, by augmenting a small, inexpensive homogenizer 18 with a coherence delay line 10, one may get a spatially uniform output with lasers having coherence lengths considerably greater than 3 mm. Without a delay line, the manufacture of a very large, high quality homogenizer with an aspect ratio capable of achieving a uniform outputs for these lasers would be impossible or prohibitively expensive.

FIGS. 3a–3d help illustrate why the prior art constraints relating the aspect ratio of the homogenizer and the coherence length of the laser beam may be relaxed. Suppose the constraints are not satisfied; this means the output of the homogenizer is still coherent, and will have interference effects that will give rise to spatial variations in intensity. The one dimensional intensity profile of the homogenizer output looks like FIG. 3a or FIG. 3b (actual intensity traces).

Figure 3B:
Figure 3C:
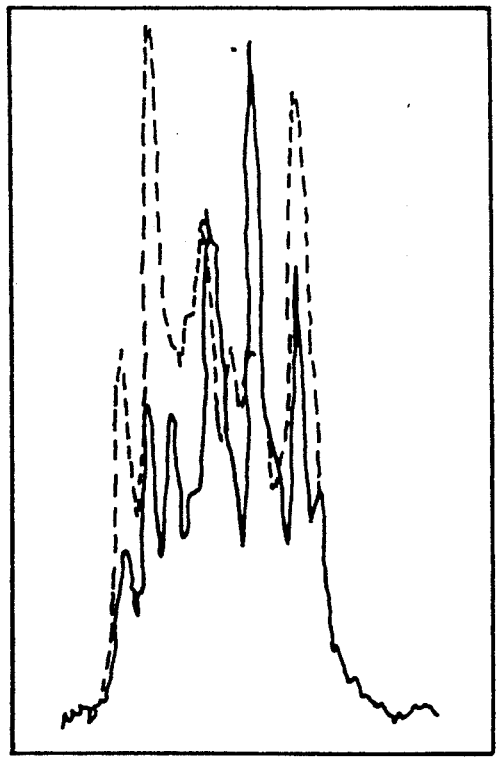
Figure 3D:
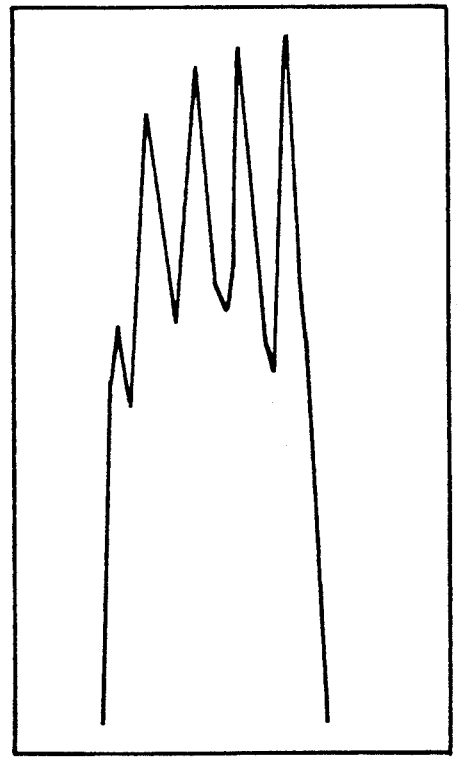

FIG. 3c is a superposition of FIGS. 3a and 3b, as if both beams were in the homogenizer simultaneously. How these beams add at the aperture of the homogenizer depends on the relative coherence delay between the two beams. If there is no delay, the beams will add coherently with large spatial variations in intensity due to the nonzero phase dependence, very much like FIG. 3a or 3b. On the other hand, if the beams are delayed by some multiple of the coherence length (the effect of the coherence delay line), the resultant output beam has an intensity that depends simply on the sun of the two constituent intensities. Although each individual beam has its own phase dependence giving rise to intensity variations (proportionally reduced with respect to the original beam), there is no phase dependence between the two beams, so the total intensity is simply the sum of the individual intensities. This looks like FIG. 3d. The key thing to be noted about FIG. 3d is that the peak-to-valley ratios are much smaller than for either FIG. 3a or 3b. There is a substantial improvement in spatial uniformity for only two beams with a coherence delay line. In a preferred embodiment, mirrors 12 and 14 are arranged so there are from six to ten beams in the delay line, and the resultant output is nearly uniform.

Figure 4A:
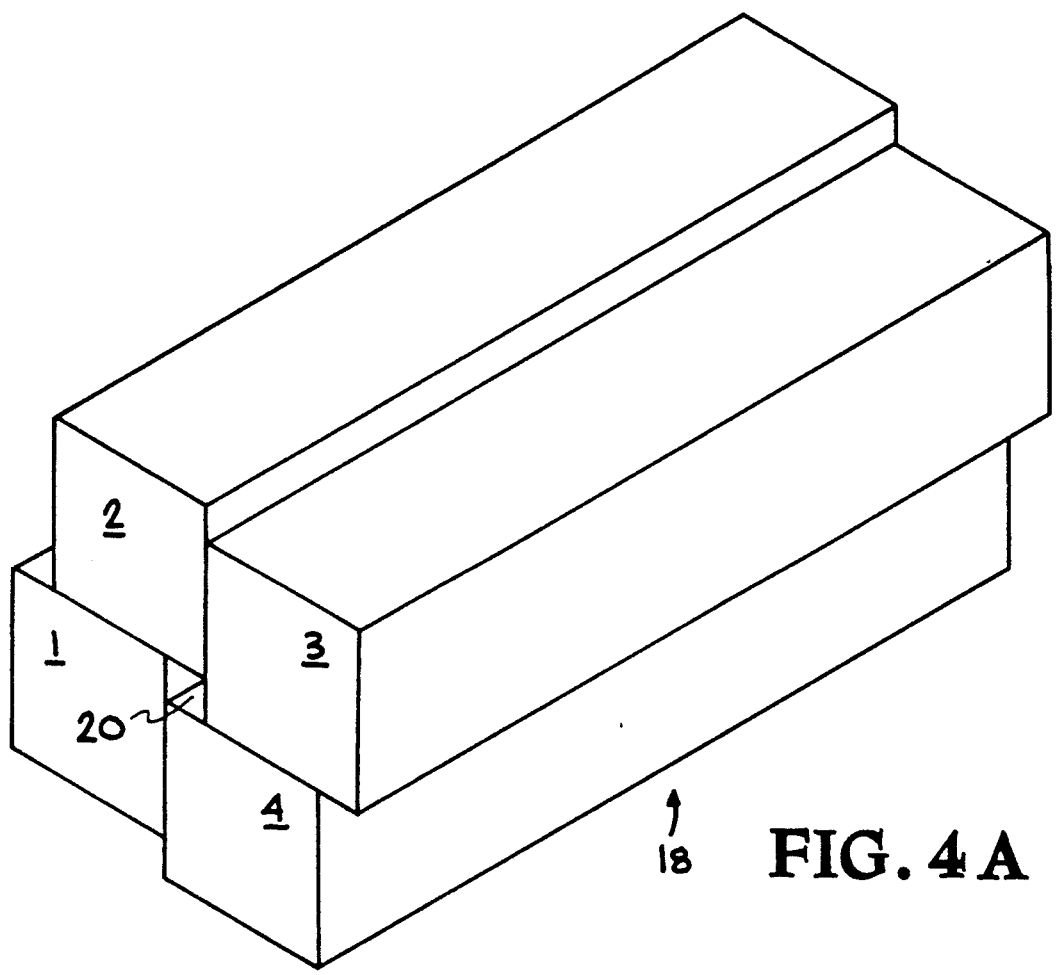
FIG. 4A and B shows a variable aperture homogenizer according to the present invention.

An improved homogenizer 18 that can be used advantageously with coherence delay line 10 is shown in FIG. 4A and B. The prior art homogenizer is a solid, polygonal rod of some clear material, generally glass. Consequently, the size of the output beam cannot be regulated without an aperture of some sort. Unfortunately, prior art apertures waste light energy by blocking it, and laser operating time may be increased. Homogenizer 18 shown in FIG. 4 A and B has a substantially different design that includes a variable sized aperture. It comprises four rectangular rods 1,2,3, and 4, preferably made of glass. All are staggered with respect to their neighbors to form an aperture or cavity 20. The faces 21, 22, 23, 24 of the rods forming the cavity are all coated with a reflective quarter wavelength multilayer coating, of MgF and TiO, for instance. This is different from the prior art in that the prior art homogenizer relies on the index of refraction of the rod material (glass) being larger than the surrounding material (air) for total internal reflection, while homogenizer 18 has a reflective coating. The cavity 20 of homogenizer 18 is filled with gas, typically air.

The width and height of the aperture may be regulated by adjusting the amount the rods are staggered with respect to their neighbors. If rod 1 is anchored, or held stationary, and rod 2 is moved only in the horizontal direction, then the width of the cavity is seen to change. On the other hand, if rod 4 is moved in the vertical direction, the height of the cavity changes. In this way the size of the output beam may be regulated without the use of prior art apertures, and the entire laser beam may be utilized for different illumination plane sizes.

Compression springs 26, 28 should be used on rod 3 to passively maintain the alignment of rod 3 with respect to rod 2 and rod 4. Also, linear translators anchored to the same mass 30 as rod 1 can be used to individually move rod 2 or rod 4 as shown schematically by arrows 32, 34 respectively.

Figure 5:
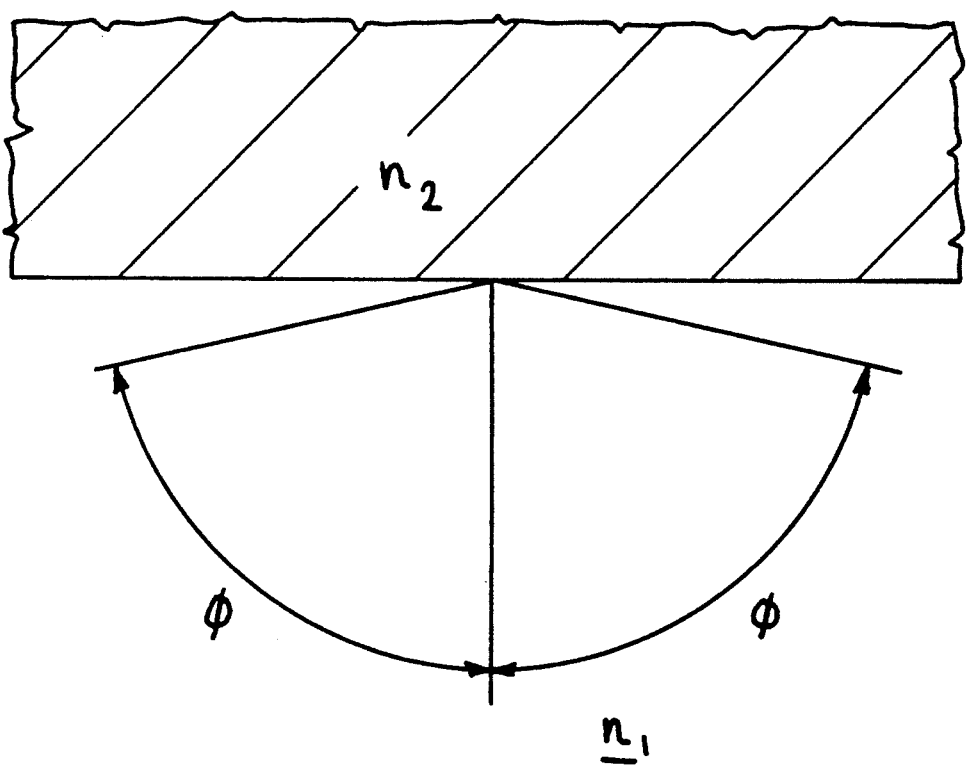
FIG. 5 shows a beam striking an internal wall of a liquid filled homogenizer according to the present invention.

One may further improve the efficiency of a homogenizer with an aperture by omitting the reflective coating and filling the cavity with liquid, as shown in FIG. 5. If this fluid has an index of refraction, $(n_1)$, greater than the index of refraction of the material, $(n_2)$, used to form the cavity walls, then total internal reflection will occur for rays incident at an angle $\phi$ with respect to the normal that satisfies this equation:

$$\phi \geq \phi_{crit} = \sin^{-1}\left(\frac{n_2}{n_1}\right)$$

Total internal reflection occurs without any loss to the reflecting light beam, and thus the input beam can have a large number of reflections without incurring any reflective losses. Under these conditions homogenizer losses are limited to reflection losses at the entrance and exit windows, and the absorption losses of the fluid. With proper choices of window coatings and fluid, losses to the homogenizer can be held to about 1%. Homogenizer 18 in FIG. 4 A and B (without the reflective coating) can be simply immersed in fluid to form a fluid filled homogenizer with a variable aperture.

To better illustrate the dimensions of the optics involved, for an Ar+ laser ($\lambda$=488 nanometers) with a 1.5 millimeter beam diameter, mirrors 12 and 14 are ⅜ inch mirrors tilted enough with respect to the optical axis to reflect the beam six to ten times before mirror 12 is traversed, thus forming six to ten transmitted beams that are incoherent with respect to each other. Suitable partially reflective and fully reflective coatings can be formed with quarter wavelength thin films, and are known to those skilled in the art.

Figure 4B:
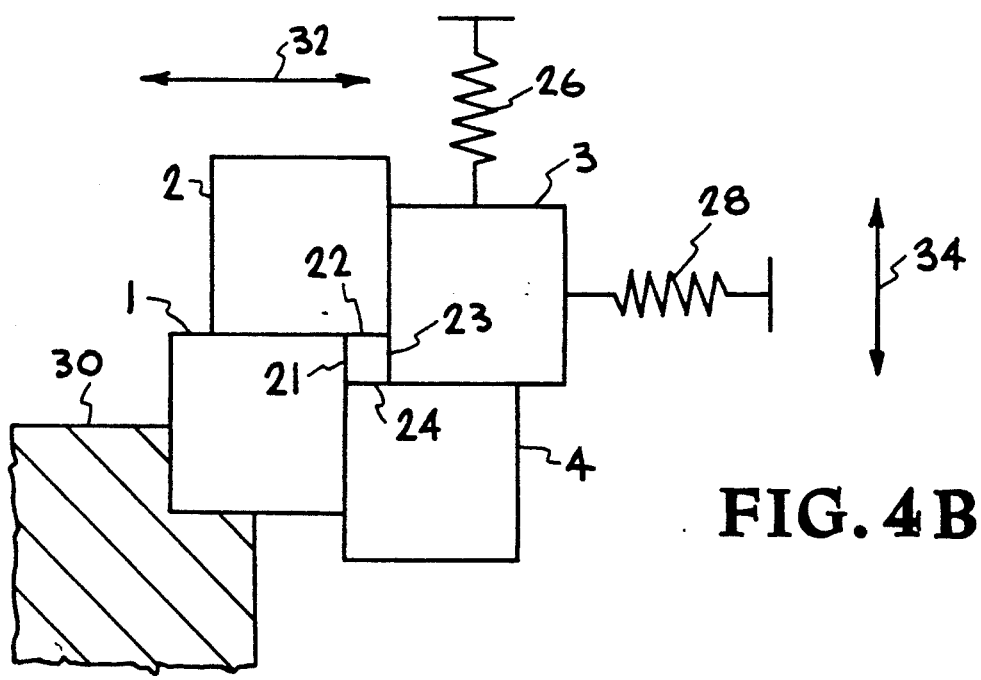

Fused silica lens 16 focuses the beams into homogenizer 18, which is of the type shown in FIG. 4 A and B and is between 150-200 mm long with a 2.5×2.5 millimeter square aperture. Another lens (not shown) at the output of homogenizer 18 may then image the beams so they recombine to form a substantially uniform output.

Other variations and embodiments are intended to fall within the scope of the invention. For instance, the number of reflections between the mirrors in the coherence delay line may be varied according to the size of the incident beam and its coherence length. Larger mirrors may accommodate larger beams for a given number of reflections, or increase the number of reflections for a given beam diameter. The air-filled variable aperture homogenizer need not be made of glass, and indeed need not be made of a transparent material, since it is covered with a reflective coating anyway. The preferred embodiment of the coherence delay line in which the partially reflective coating is formed in sections having increasing transmission coefficients need not have successively fewer quarter wavelength layers of the coating, but may have a coating in which other parameters have been varied to provide the increasing transmission coefficients. Many variations are possible. The full scope of the invention is only intended to be limited by the following claims.

We claim:

1. An optical system comprising a light beam, a coherence delay line, and a homogenizer, wherein:
    said coherence delay line comprises a first partially reflecting mirror and a second totally reflecting mirror, and;
    said homogenizer comprises a light tunnel with transparent ends and reflective sidewalls, wherein;
    at least a portion of said light beam is incident upon said partially reflecting mirror at a first position where a portion is transmitted into said homogenizer, and a portion is reflected into said totally reflecting mirror.

2. The system of claim 1 wherein said light beam has a coherence length greater than 3 millimeters, and said first and second mirrors are separated by an integral multiple of half of said coherence length.

3. The system of claim 1 wherein the portion of said light beam that is reflected into said totally reflecting mirror is reflected back into said partially reflecting mirror at a second position different from the first position, where a portion is transmitted into said homogenizer, and a portion is reflected back into said totally reflecting mirror.

4. The system of claim 3 wherein the reflection and transmission process is repeated until a portion of said light beam is reflected directly from said totally reflecting mirror into said homogenizer.

5. The system of claim 4 wherein all portions of said light beam that are transmitted through said partially reflecting mirror are substantially equal in intensity.

6. The system of claim 5 wherein the thickness of the partially reflective coating on said partially reflective mirror decreases at each successive position of incidence by said beam.

7. The system of claim 1 wherein said homogenizer comprises a light tunnel with a variable cross section.

8. The system of claim 7 wherein said light tunnel is a polygonal cavity formed by four rods with rectangular cross sections that are contiguous with, and staggered with respect to their neighbors, and said rods are coated with a reflective coating on at least the sides forming said light tunnel sidewalls.

9. The system of claim 1 wherein said light tunnel is a polygonal cavity filled with a liquid having a greater index of refraction than the material forming said light tunnel sidewalls.

10. A coherence delay line comprising a laser beam, a first partially reflective mirror, and a second totally reflective mirror, wherein:
   said first and second mirrors have planar surfaces facing each other, and;
   said laser beam is incident upon said first mirror at a first position where a portion is transmitted, and a portion is reflected towards, and then reflected from said second mirror, wherein;
   the portion reflected from said second mirror is parallel to said incident laser beam.

11. The delay line of claim 10 wherein the portion reflected from said second mirror strikes said first mirror at a position different from said first position, where again a portion is transmitted, and a portion is reflected towards, and then reflected from said second mirror.

12. The delay line of claim 11 wherein the beam is successively reflected back and forth between said first and second mirrors, and each time the beam strikes said first mirror a portion is transmitted, and a portion is reflected towards, and then reflected from said second mirror.

13. The delay line of claim 12 wherein the transmitted portions all have substantially equal intensities.

14. The delay line of claim 10 wherein the reflective coatings on said mirrors are made from quarter wavelength thin films.

15. A homogenizer comprising a polygonal cavity either filled with a gas, and having a reflective coating on the cavity walls, or;
   filled with a liquid having an index of refraction greater than the material of the cavity walls.

16. The homogenizer of claim 15 comprising a plurality of polygonal rods that are contiguous with, and staggered with respect to their neighbors to form a polygonal cavity with adjustable dimensions.

17. The homogenizer of claim 16 wherein the cross section of said polygonal cavity is rectangular.

* * * * *